(12) United States Patent
Cok et al.

(10) Patent No.: US 7,710,026 B2
(45) Date of Patent: May 4, 2010

(54) LED DEVICE HAVING IMPROVED OUTPUT AND CONTRAST

(75) Inventors: Ronald S. Cok, Rochester, NY (US); Lee W. Tutt, Webster, NY (US)

(73) Assignee: Global OLED Technology LLC, Wilmington, DE (US)

( * ) Notice: Subject to any disclaimer, the term of this patent is extended or adjusted under 35 U.S.C. 154(b) by 342 days.

(21) Appl. No.: 11/754,430

(22) Filed: May 29, 2007

(65) Prior Publication Data
US 2008/0061687 A1   Mar. 13, 2008

Related U.S. Application Data

(63) Continuation-in-part of application No. 11/297,196, filed on Dec. 8, 2005, now Pat. No. 7,466,075.

(51) Int. Cl.
H01J 1/62 (2006.01)
H01J 63/04 (2006.01)
(52) U.S. Cl. ..................... 313/506; 313/512
(58) Field of Classification Search ......... 313/498–512; 315/169.3; 345/76; 445/24, 25
See application file for complete search history.

(56) References Cited

U.S. PATENT DOCUMENTS

| | | | |
|---|---|---|---|
| 4,476,292 A | | 10/1984 | Ham et al. |
| 4,769,292 A | | 9/1988 | Tang et al. |
| 5,247,190 A | | 9/1993 | Friend et al. |
| 5,254,388 A | | 10/1993 | Melby et al. |
| 5,955,837 A | | 9/1999 | Horikx et al. |
| 6,025,894 A | * | 2/2000 | Shirasaki et al. ............ 349/69 |

(Continued)

FOREIGN PATENT DOCUMENTS

JP   05-215908   8/1993

(Continued)

OTHER PUBLICATIONS

Matoussi et al, "Electroluminescence from heterostructures of poly(phenylene vinylene) and inorganic CdSe nanocrystals," Journal of Applied Physics 83, 7965 (1998).

(Continued)

*Primary Examiner*—Peter J Macchiarolo
*Assistant Examiner*—Glenn Zimmerman
(74) *Attorney, Agent, or Firm*—McKenna Long & Aldridge LLP

(57) ABSTRACT

An electroluminescent (EL) device having an LED formed on a substrate with at least two electrodes formed over the substrate, and an EL unit formed between the electrodes. At least one of the electrodes is transparent. At least one of the electrodes is patterned to define independently controllable light-emitting areas. A cover is formed over the LED. The cover or substrate is transparent. A light-scattering layer is formed between the cover and substrate for scattering light. A low-index element, having an optical index lower than other optical indices, is formed between the scattering layer and the transparent cover or substrate. Additionally, a contrast-enhancement layer includes alternating light-absorbing portions and light-transmissive portions formed in the layer located between the light-scattering layer and the transparent substrate or cover through which light is emitted, wherein the light-absorbing portions and light-transmissive portions are located in each light-emitting area.

20 Claims, 9 Drawing Sheets

U.S. PATENT DOCUMENTS

| | | | |
|---|---|---|---|
| 6,410,168 B1 * | 6/2002 | Tamura | 428/690 |
| 6,608,449 B2 * | 8/2003 | Fukunaga | 315/169.3 |
| 6,777,871 B2 | 8/2004 | Duggal et al. | |
| 6,787,796 B2 | 9/2004 | Do et al. | |
| 7,466,075 B2 * | 12/2008 | Cok et al. | 313/506 |
| 2001/0026124 A1 | 10/2001 | Liu et al. | |
| 2002/0011783 A1 * | 1/2002 | Hosokawa | 313/504 |
| 2003/0203551 A1 * | 10/2003 | Cok et al. | 438/200 |
| 2004/0061136 A1 | 4/2004 | Tyan et al. | |
| 2004/0191548 A1 | 9/2004 | Takemoto | |
| 2004/0217702 A1 | 11/2004 | Garner et al. | |
| 2005/0018431 A1 | 1/2005 | Shiang | |
| 2005/0142379 A1 * | 6/2005 | Juni et al. | 428/690 |
| 2005/0194896 A1 | 9/2005 | Sugita et al. | |
| 2007/0013293 A1 * | 1/2007 | Cok | 313/504 |

FOREIGN PATENT DOCUMENTS

| | | |
|---|---|---|
| JP | 07-239467 | 9/1995 |
| JP | 2001-67006 | 3/2001 |
| JP | 2001-256816 | 9/2001 |
| WO | 02/37580 | 5/2002 |
| WO | 2005/092544 | 10/2005 |

OTHER PUBLICATIONS

Hikmet et al., "Study of conduction mechanism and electroluminescence in CdSe/ZnS quantum dot composites," Journal of Applied Physics 93, 3509 (2003).

Mueller et al., "Multicolor Light-Emitting Diodes Based on Semiconductor Nanocrystals Encapsulated in GaN Charge Injection," Nano Letters 5, pp. 1039-1044, (2005).

Tang et al., "Organic electroluminescent diodes," Applied Physics Letters, 51, 913, (1987).

Tang et al., "Electroluminescence of doped organic thin films," Journal of Applied Physics 65, 3610, (1989).

Coe et al., "Electroluminescence from single monolayers of nanocrystals in molecular organic devices," Nature 420, pp. 800-803 (2002).

U.S. Appl. No. 11/065,082, filed Feb. 24, 2005, Cok et al.

* cited by examiner

LED DEVICE HAVING IMPROVED OUTPUT AND CONTRAST

CROSS-REFERENCE RELATED APPLICATIONS

This is a continuation-in-part of application Ser. No. 11/297,196, filed on Dec. 8, 2005, now U.S. Pat. No. 7,466,075, entitled "OLED Device Having Improved Output and Contrast", in the names of Ronald S. Cok and Lee W. Tutt.

FIELD OF THE INVENTION

The present invention relates to electroluminescent devices, and more particularly, to electroluminescent device structures for improving light output and contrast.

BACKGROUND OF THE INVENTION

Electroluminescent devices are a promising technology for flat-panel displays and area illumination lamps. These devices rely upon thin-film layers of materials coated upon a substrate, and include organic, inorganic and hybrid inorganic-organic light-emitting diodes. The thin-film layers of materials can include, for example, organic materials, quantum dots, fused inorganic nano-particles, electrodes, conductors, and silicon electronic components as are known and taught in the LED art.

Irrespective of the particular electroluminescent device configuration tailored to these broad fields of applications, all electroluminescent devices function on the same general principles. An electroluminescent (EL) unit is sandwiched between two electrodes. At least one of the electrodes is at least partially light transmissive. These electrodes are commonly referred to as an anode and a cathode in analogy to the terminals of a conventional diode. When an electrical potential is applied between the electrodes so that the anode is connected to the positive terminal of a voltage source and the cathode is connected to the negative terminal, the LED is said to be forward-biased. Positive charge carriers (holes) are injected from the anode into the EL unit, and negative charge carriers (electrons) are injected from the cathode. Such charge carrier injection causes current flow from the electrodes through the EL unit. Recombination of holes and electrons occurs within the light emitting layer and results in emission of light. For example, electroluminescent devices containing quantum dot light-emitting diode (LED) structures can be either inorganic or hybrid inorganic-organic, and the recombination of the holes and electrons occurs within the core of a quantum dot in the light-emitting layer. A hybrid inorganic-organic EL unit can be formed of a stack of sub-layers that can include small-molecule layers or polymer layers.

In the late 1990's LED devices containing mixed emitters of organics and quantum dots were introduced (Mattoussi et al., Journal of Applied Physics 83, 7965 (1998)). Quantum dots are light-emitting, nano-sized semiconductor crystals. Adding quantum dots to the emitter layers could enhance the color gamut of the device; red, green, and blue emission could be obtained by simply varying the quantum-dot particle size; and the manufacturing cost could be reduced. Because of problems such as aggregation of the quantum dots in the emitter layer, the efficiency of these devices was rather low in comparison with typical OLED devices. The efficiency was even poorer when a neat film of quantum dots was used as the emitter layer (Hikmet et al., Journal of Applied Physics 93, 3509 (2003)). The poor efficiency was attributed to the insulating nature of the quantum-dot layer. Later the efficiency was boosted (to ~1.5 cd/A) upon depositing a mono-layer film of quantum dots between organic hole and electron transport layers (Coe et al., Nature 420, 800 (2002)). It was stated that luminescence from the quantum dots occurred mainly as a result of Forster energy transfer from excitons on the organic molecules (electron-hole recombination occurs on the organic molecules). Regardless of improvements in efficiency, these hybrid devices still suffer from all of the drawbacks associated with pure OLED devices.

Recently, a mainly all-inorganic LED was constructed (Mueller et al., Nano Letters 5, 1039 (2005)) by sandwiching a monolayer thick core/shell CdSe/ZnS quantum-dot layer between vacuum deposited inorganic n- and p-GaN layers. The resulting device had a poor external quantum efficiency of 0.001 to 0.01%. Part of that problem could be associated with the organic ligands of trioctylphosphine oxide (TOPO) and trioctylphosphine (TOP) that were reported to be present post growth. These organic ligands are insulators and would result in poor electron and hole injection into the quantum dots. In addition, the remainder of the structure is costly to manufacture, due to the usage of electron and hole semiconducting layers grown by high-vacuum techniques, and the usage of sapphire substrates.

As described in co-pending, commonly assigned U.S. Ser. No. 11/226,622 by Kahen, which is hereby incorporated by reference in its entirety, additional semiconductor nanoparticles may be provided with the quantum dots in a layer to enhance the conductivity of the light-emitting layer.

OLED devices generally can have two formats known as small molecule devices such as disclosed in U.S. Pat. No. 4,476,292 and polymer OLED devices such as disclosed in U.S. Pat. No. 5,247,190. Either type of OLED device may include, in sequence, an anode, an organic EL element, and a cathode. In most designs, one of the electrodes is reflective and the other transparent. The organic EL element disposed between the anode and the cathode commonly includes an organic hole-transporting layer (HTL), a light-emissive layer (LEL), and an organic electron-transporting layer (ETL). Holes and electrons recombine and emit light in the LEL layer. Tang et al. (Applied Physics Letters, 51, 913 (1987), Journal of Applied Physics, 65, 3610 (1989), and U.S. Pat. No. 4,769,292) demonstrated highly efficient OLEDs using such a layer structure. Since then, numerous OLEDs with alternative layer structures, including polymeric materials, have been disclosed and device performance has been improved.

Light is generated in an LED device when electrons and holes that are injected from the cathode and anode, respectively, flow through the respective charge-transport layers and recombine in the emissive layer. Many factors determine the efficiency of this light generating process. For example, the selection of anode and cathode materials can determine how efficiently the electrons and holes are injected into the device; the selection of ETL and HTL can determine how efficiently the electrons and holes are transported in the device, and the selection of LEL can determine how efficiently the electrons and holes be recombined and result in the emission of light, etc.

However, electroluminescent devices generally suffer from poor ambient contrast because of the reflectivity of the reflective electrode. Such a reflector tends to reflect ambient light thus reducing the contrast between the emitted light and the ambient light and decreasing the image quality of the LED device. One approach to addressing this problem is to use circular polarizers. For example, the Eastman Kodak LS633 digital camera employed such means to improve ambient contrast in an active-matrix OLED display. However, such polarizers are expensive and also absorb as much as 40% of the emitted light.

The use of louver films comprising alternating light-transmissive and light-absorbing portions as privacy securing and contrast improving films for display devices has been suggested, e.g., as described in US Patent 2004/0191548 and in WO 2005/092544 A1. Such louver films are typically employed on the top surface of a display device, and while effective at reducing viewing angles, typically have not been suggested for use in displays with improved light output and sharpness of display images.

It has also been found, that one of the key factors that limits the efficiency of LED devices is the inefficiency in extracting the photons generated by the electron-hole recombination out of the LED devices. Due to the high optical indices of the materials used, most of the photons generated by the recombination process are actually trapped in the devices due to total internal reflection. These trapped photons never leave the LED devices and make no contribution to the light output from these devices. Because light is emitted in all directions from the internal layers of the LED, some of the light is emitted directly from the device, and some is emitted into the device and is either reflected back out or is absorbed, and some of the light is emitted laterally and trapped and absorbed by the various layers comprising the device. In general, up to 80% of the light may be lost in this manner.

A typical OLED device uses a glass substrate, a transparent conducting anode such as indium-tin-oxide (ITO), a stack of organic layers, and a reflective cathode layer. Light generated from the device is emitted through the glass substrate. This is commonly referred to as a bottom-emitting device. Alternatively, a device can include a substrate, a reflective anode, a stack of organic layers, and a top transparent cathode layer and transparent cover. Light generated from the device is emitted through the top transparent electrode and transparent cover. This is commonly referred to as a top-emitting device. In these typical devices, the index of the ITO layer, the organic layers, and the glass is about 2.0, 1.7, and 1.5 respectively. It has been estimated that nearly 60% of the generated light is trapped by internal reflection in the ITO/organic EL element, 20% is trapped in the glass substrate, and only about 20% of the generated light is actually emitted from the device and performs useful functions.

In any of these LED structures, the problem of trapped emitted light and reflected ambient light remains. Referring to FIG. 9, a bottom-emitting LED device as known in the prior art is illustrated having a transparent substrate 10, a transparent first electrode 12, an EL unit 14 which contains a light-emitting layer, a reflective second electrode 16, a gap 19 and a cover 20. The gap 19 is typically filled with desiccating material. Light emitted from one of the EL unit 14 can be emitted directly out of the device, through the transparent substrate 10, as illustrated with light ray 1. Light may also be emitted and internally guided in the transparent substrate 10 and EL unit 14, as illustrated with light ray 2. Additionally, light may be emitted and internally guided in the EL unit 14, as illustrated with light ray 3. Light rays 4 emitted toward the reflective electrode 16 are reflected back toward the substrate 10 and follow one of the light ray paths 1, 2, or 3. Ambient light 6 incident on the LED may be reflected from the reflective electrode 16, thereby reducing the ambient contrast of the LED device. In some prior-art embodiments, the electrode 16 may be opaque and/or light absorbing. Such an arrangement will increase the contrast by absorbing ambient light, but also absorbs the light 4 emitted toward the electrode 16. The bottom-emitter embodiment shown may also be implemented in a top-emitter configuration with a transparent cover and top electrode 16.

Scattering techniques are known to assist in extracting light from LED devices. Chou (International Publication Number WO 02/37580 A1) and Liu et al. (U.S. Patent Application Publication No. 2001/0026124 A1) taught the use of a volume or surface scattering layer to improve light extraction. The scattering layer is applied next to the organic layers or on the outside surface of the glass substrate and has optical index that matches these layers. Light emitted from the OLED device at higher than critical angle that would have otherwise been trapped can penetrate into the scattering layer and be scattered out of the device. The efficiency of the OLED device is thereby improved, but still has deficiencies as explained below. Moreover, the contrast of the device is not improved under diffuse illumination.

U.S. Pat. No. 6,787,796 entitled "Organic electroluminescent display device and method of manufacturing the same" by Do et al issued 20040907 describes an organic electroluminescent (EL) display device and a method of manufacturing the same. The organic EL device includes a substrate layer, a first electrode layer formed on the substrate layer, an organic layer formed on the first electrode layer, and a second electrode layer formed on the organic layer, wherein a light-loss preventing layer having different refractive index areas is formed between layers of the organic EL device having a large difference in refractive index among the respective layers. U.S. Patent Application Publication No. 2004/0217702 entitled "Light extracting designs for organic light emitting diodes" by Garner et al., similarly discloses use of microstructures to provide internal refractive index variations or internal or surface physical variations that function to perturb the propagation of internal waveguide modes within an OLED. When employed in a top-emitter embodiment, the use of an index-matched polymer adjacent the cover is disclosed.

Light-scattering layers used externally to an OLED device are described in U.S. Patent Application Publication No. 2005/0018431 entitled "Organic electroluminescent devices having improved light extraction" by Shiang and U.S. Pat. No. 5,955,837 entitled "System with an active layer of a medium having light-scattering properties for flat-panel display devices" by Horikx, et al. These disclosures describe and define properties of scattering layers located on a substrate in detail. Likewise, U.S. Pat. No. 6,777,871 entitled "Organic ElectroLuminescent Devices with Enhanced Light Extraction" by Duggal et al., describes the use of an output coupler comprising a composite layer having specific refractive indices and scattering properties. While useful for extracting light, this approach will only extract light that propagates in the substrate (illustrated with light ray 2) and will not extract light that propagates through the organic layers and electrodes (illustrated with light ray 3).

In any case, scattering techniques, by themselves, cause light to pass through the light-absorbing material layers multiple times where they are absorbed and converted to heat. Moreover, trapped light may propagate a considerable distance horizontally through the cover, substrate, or organic layers before being scattered out of the device, thereby reducing the sharpness of the device in pixellated applications such as displays. For example, as illustrated in FIG. 10, a prior-art pixellated bottom-emitting LED device may include a plurality of independently controlled sub-pixels 50, 52, 54, 56, and 58 and a scattering layer 22 located between the transparent first electrode 12 and the substrate 10. A light ray 5 emitted from the light-emitting layer may be scattered multiple times by scattering layer 22, while traveling through the substrate 10, EL unit(s) 14, and transparent first electrode 12 before it is emitted from the device. When the light ray 5 is finally emitted from the device, the light ray 5 has traveled a considerable distance through the various device layers from the original sub-pixel 50 location where it originated to a remote sub-pixel 58 where it is emitted, thus reducing sharpness. Most of the lateral travel occurs in the substrate 10, because that is by far the thickest layer in the package. Also, the amount of light emitted is reduced due to absorption of light in the various layers.

U.S. Patent Application Publication No. 2004/0061136 entitled, "Organic light emitting device having enhanced light extraction efficiency" by Tyan et al., describes an enhanced light-extraction OLED device that includes a light-scattering layer. In certain embodiments, a low-index isolation layer (having an optical index substantially lower than that of the organic electroluminescent element) is employed adjacent to a reflective layer in combination with the light-scattering layer to prevent low-angle light from striking the reflective layer, and thereby minimize absorption losses due to multiple reflections from the reflective layer. The particular arrangements, however, may still result in reduced sharpness of the device and does not improve contrast.

Co-pending, commonly assigned U.S. Ser. No. 11/065,082, filed Feb. 24, 2005, describes the use of a transparent low-index layer having a refractive index lower than the refractive index of the cover or substrate through which light is emitted and lower than the organic layers to enhance the sharpness of a LED device having a scattering element. US 20050194896 describes a nano-structure layer for extracting radiated light from a light-emitting device together with a gap having a refractive index lower than an average refractive index of the emissive layer and nano-structure layer. Such disclosed designs, however, do not improve the contrast of the device.

It is known to improve the contrast of a LED device by employing, for example, black-matrix materials between the light-emitting areas or by using color filters. While such methods are useful, the presence of a reflective electrode still decreases the ambient contrast significantly. As noted above, circular polarizers may be employed, but applicants have determined that light-extraction techniques such as scattering layers tend to be incompatible with such polarizers.

There is a need therefore for an improved light-emitting diode device structure that avoids the problems noted above and improves the efficiency and sharpness of the device.

SUMMARY OF THE INVENTION

In accordance with one embodiment, the invention is directed towards an electroluminescent (EL) device having an LED formed on a substrate with a first electrode formed over the substrate, a second electrode formed over the first electrode, and an EL unit formed between the electrodes. At least one of the first or second electrodes is transparent, the EL unit having a first optical index, and wherein at least one of the first or second electrodes is patterned to define independently controllable light-emitting areas. A cover is formed over the LED. The cover or substrate is transparent and has a second optical index and the light is emitted through the transparent cover or substrate. A light-scattering layer is formed between the cover and substrate for scattering light. A low-index element having an optical index lower than the first and second optical indices is formed between the scattering layer and the transparent cover or substrate. Additionally, a contrast-enhancement layer includes a plurality of alternating light-absorbing portions and light-transmissive portions formed in the layer located between the light-scattering layer and the transparent substrate or cover through which light is emitted, wherein a plurality of light-absorbing portions and light-transmissive portions are located in each light-emitting area.

ADVANTAGES

The present invention has the advantage that it improves the light efficiency and ambient contrast of electroluminescent devices.

It will be understood that the figures are not to scale since the individual layers are too thin and the thickness differences of various layers too great to permit depiction to scale.

DETAILED DESCRIPTION OF THE INVENTION

Figure 1:
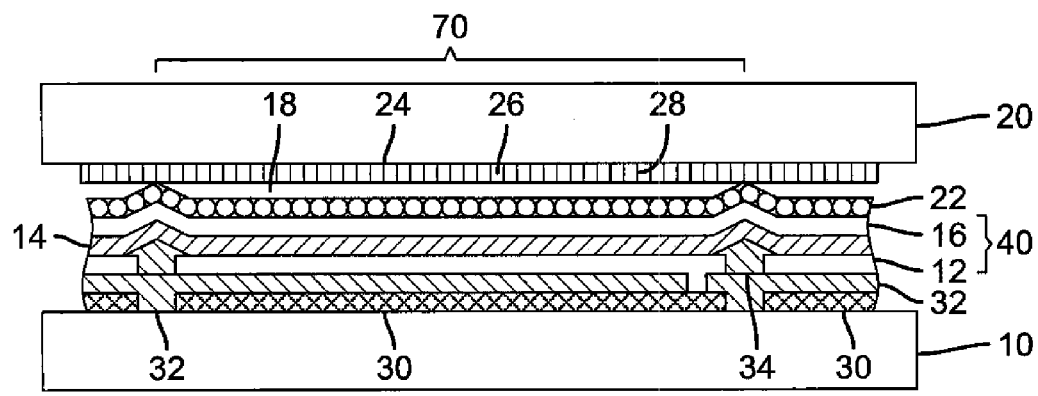
FIG. 1 illustrates a cross section of a top-emitter LED device according to one embodiment of the present invention.

Referring to FIG. 1, in accordance with one embodiment of the present invention, an light-emitting diode (LED) device, comprises an LED 40 formed over a substrate 10 having a first patterned electrode 12 defining independently controllable light-emitting areas 70, and a transparent second electrode 16 formed over the first electrode, wherein one or more EL unit(s) 14 are formed between the electrodes 12 and 16, the EL unit(s) 14 having a first optical index. A transparent cover 20 is formed over the LED 40 and has a second optical index, and light is emitted through the transparent cover 20. A light-scattering layer 22 is formed between the cover 20 and substrate 10 for scattering light. A low-index element 18 having an optical index lower than the first and second optical indices is formed between the scattering layer 22 and the transparent cover 20. A contrast-enhancement layer 24 comprising a plurality of alternating light-absorbing portions 28 and light-transmissive portions 26 formed in the layer is located between the light-scattering layer and the transparent cover through which light is emitted, wherein a plurality of light-absorbing portions 28 and light-transmissive portions 26 are located in each light-emitting area 70.

Figure 4:
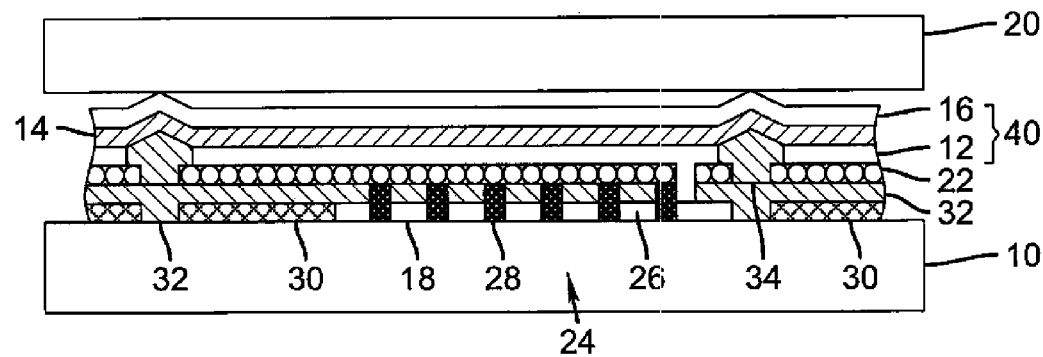
FIG. 4 illustrates a cross section of a bottom-emitter LED device according to an embodiment of the present invention.

In various embodiments, the present invention may be in a top-emitter configuration (as shown in FIG. 1) or a bottom-emitter configuration (FIG. 4). In the top-emitter configuration of FIG. 1, light is emitted through the cover 20; the electrode 16 and cover 20 are typically transparent while the electrode 12 is reflective and the substrate 10 may be opaque, reflective, absorptive, or transparent. In the bottom-emitter configuration of FIG. 4, light is emitted through the substrate 10; the electrode 12 and substrate 10 are typically transparent while the electrode 16 is reflective and the cover 20 may be opaque, reflective, absorptive, or transparent.

The present invention may be employed in either a passive- or active-matrix configuration. In the active-matrix configuration of FIG. 1, thin-film electronic components 30 are formed on the substrate and electrically connected to patterned electrodes 12 to form sub-pixel light-emitting areas. A planarization layer 32 protects the thin-film electronic components 30. A second planarization layer 34 separates the patterned electrodes 12. In a passive-matrix configuration (not shown), light-emitting areas are typically defined by overlapping areas of first and second orthogonally arranged stripe-patterned electrodes.

Figure 5:
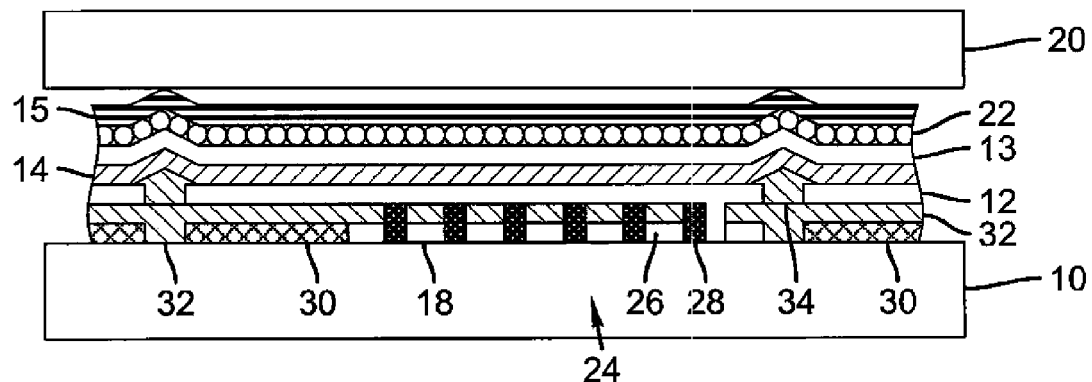
FIG. 5 illustrates a cross section of a bottom-emitter LED device having a reflective layer according to yet another embodiment of the present invention.
Figure 6:
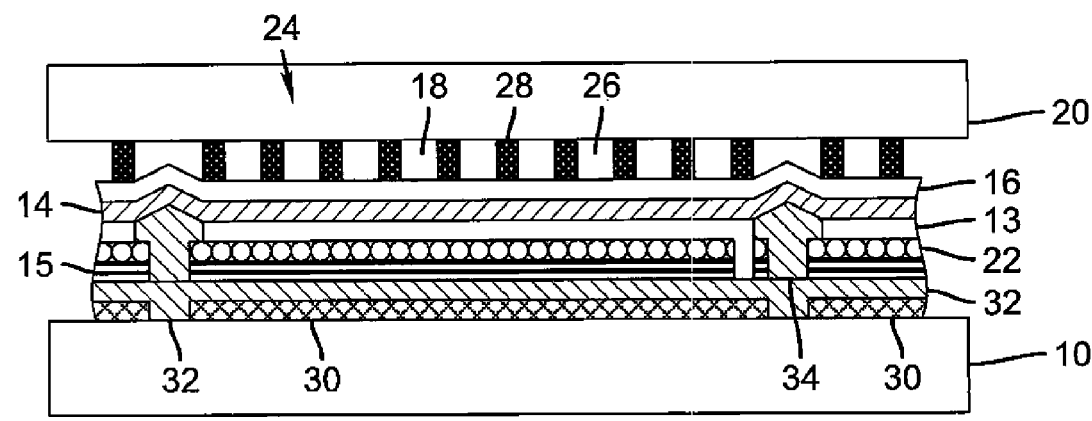
FIG. 6 illustrates a cross section of a top-emitter LED device having a reflective layer according to yet another embodiment of the present invention.

According to various embodiments of the present invention, the scattering layer 22 may have various locations. As illustrated in FIG. 1, the scattering layer 22 is formed adjacent to the transparent electrode 16. In the bottom-emitter configuration of FIG. 4, the scattering layer 22 is formed adjacent to the transparent electrode 12. In these embodiments, light is emitted from the LED device through the scattering layer 22. In alternative bottom- and top-emitting embodiments of the present invention shown in FIGS. 5 and 6 respectively, the scattering layer is formed between a transparent conductive layer 13 and a reflective layer 15. In these embodiments, the reflective electrode is formed from the transparent conductive layer 13 and the reflective layer 15. The scattering layer is located between the conductive layer 13 and the reflective layer 15 to form a reflective scattering layer in combination with a conductive electrode. Alternatively, the electrode may have a rough, light-scattering surface and be a light-scattering electrode so that the scattering layer 22 and an electrode are the same element. Regardless of its location or composition, the scattering layer 22 is positioned so that light emitted by the EL unit(s) 14 must either pass through or be reflected by the scattering layer 22.

Figure 12:
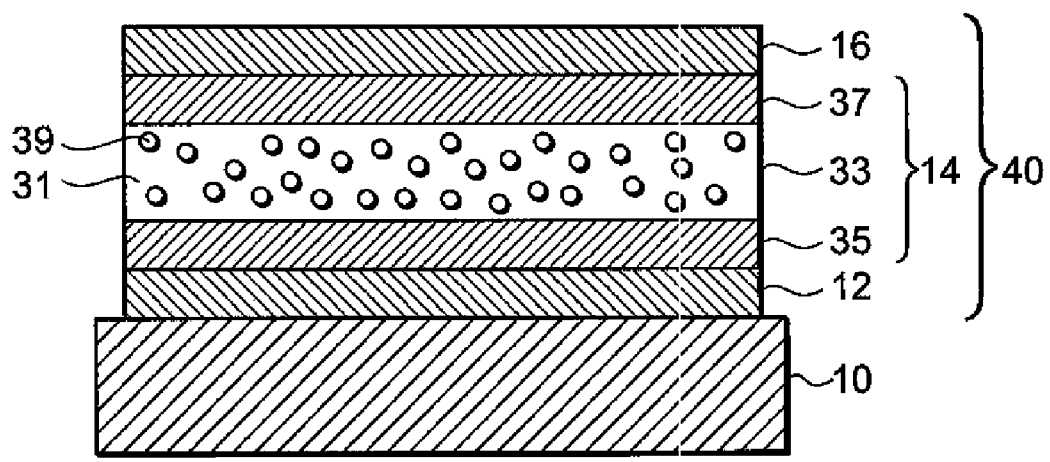
FIG. 12 is a cross section of an LED device.

As illustrated in FIG. 1, the EL unit 14 can be better understood from examination of FIG. 12. A typical LED 40 structure is shown to contain an electroluminescent (EL) unit 14 between a first electrode 12 and second electrode 16. The EL unit 14 as illustrated contains all layers between the first electrode 12 and the second electrode 16, but not the electrodes 12 and 16 themselves. The light-emitting layer 33 can contain any material that emits light by the recombination of holes and electrons. In one embodiment, illustrated in FIG. 12, light-emitting layer 33 contains light-emitting quantum dots 39 in a semiconductor matrix 31. Quantum dots as used in this disclosure are light-emitting nanoparticles. As illustrated in FIG. 12, the quantum dots can be spherical but should not be limited to this shape. Light-emitting nanoparticles can have any shape, including spheres, rods and wires, so long as they are inorganic crystalline nanoparticles that have a length in at least one dimension of less than 100 nm. Preferably, the light-emitting nanoparticles exhibit quantum confinement effects. Semiconductor matrix 31 can be an organic host material in the case of hybrid devices, or a polycrystalline inorganic semiconductor matrix in the case of inorganic quantum dot LEDs. EL unit 14 can optionally contain p-type or n-type charge-transport layers 35 and 37, respectively, in order to improve charge injection. EL unit 14 can have additional charge-transport layers, or contact layers (not shown). One typical LED device uses a glass substrate, a transparent conducting anode such as indium-tin-oxide (ITO), an EL unit 14 containing a stack of layers, and a reflective cathode layer. The layers in the EL unit 14 can be organic, inorganic, or a combination thereof.

Figure 9:
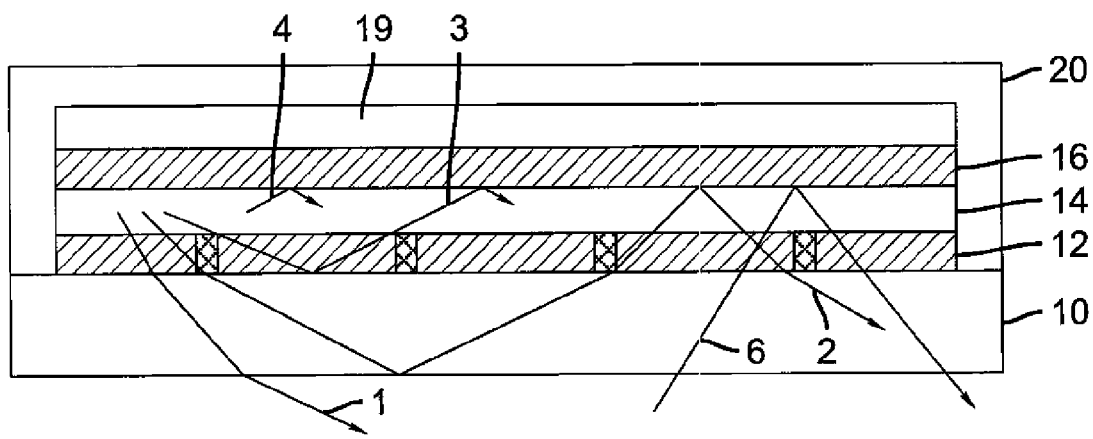
FIG. 9 illustrates a cross section of a prior-art bottom-emitter LED device having trapped light.

In a preferred embodiment, all layers formed between the scattering layer 22 and the EL unit 14 have an optical (refractive) index higher than the optical index of the EL unit(s) 14. In particular, transparent electrodes are typically made of ITO that has an optical index higher than that of the light-emitting EL unit(s) 14. In such an embodiment, all of the emitted light that does not directly escape from the LED device (shown by light rays 2, 3, and 4 in FIG. 9) will encounter the scattering layer 22 and none will be trapped within the LED layers. However, in alternative embodiments of the present invention, protective layers (not shown) having a lower optical index of refraction may be employed between the LED 40 and the scattering layer 22 to encapsulate or protect the electrodes and organic layers. In such a case, some of the light may be trapped within the LED 40. In the embodiments in which the LED 40 is formed over the scattering layer 22, it may be preferred to employ a transparent smoothing layer or a transparent, thin, high-resistance layer over the scattering layer 22 to reduce the number of defects or shorts in the LED device.

Figure 10:
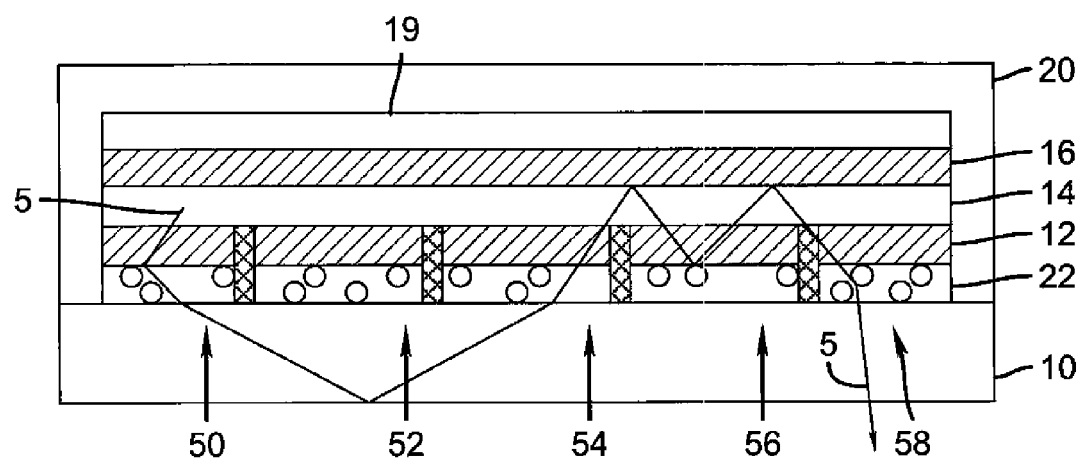
FIG. 10 illustrates a cross section of a prior-art bottom-emitter LED device having a scattering surface and reduced sharpness.

A low-index element 18 is employed between the scattering layer 22 and the substrate 10 (for a bottom emitter) or cover 20 (for a top emitter). This low-index element layer 18 serves to prevent light trapping in the substrate 10 or cover 20 since any light that passes into the low-index layer 18 can then pass through the relatively higher-index cover 20 or substrate 10 without traveling a long distance (as illustrated in FIG. 10). Hence, the low-index layer 18 will maintain the sharpness of a pixellated LED device.

The contrast-enhancement element 24 may also be positioned in various locations in various embodiments of the present invention. Referring to FIG. 1 in a top-emitter embodiment, the contrast-enhancement element 24 is formed in a film positioned adjacent to the cover 20. The film may be a self-supporting film manufactured separately and may employ, for example, micro-louver technology as described in US Patent 2004/0191548 and in WO 2005/092544 A1, the disclosures of which are incorporated herein by reference. If a film is employed, the light-transmissive portions 26 may be formed of, for example, polymer. In order to enhance the light transmissivity of the transmissive portions 26, the film is preferably thin, for example less than 1 mm, more preferably less than 0.5 mm. In an alternative embodiment illustrated in FIG. 2, the contrast-enhancement element 24 may be formed directly on the inside of cover 20, for example by employing photolithography for forming light-absorbing portions 28 of carbon black-impregnated resins and light-transmissive portions 26. In this embodiment, the light-transmissive portions 26 may also serve as the low-index element 18. In yet another alternative embodiment shown in FIG. 3, the light-absorbing portions 28 of contrast-enhancement element 24 may be formed on the electrode 12, or on planarization layers beneath the electrode 12 (not shown). The light-absorbing portions 28 may be pattern-deposited using existing technologies, for example curable polymer materials including carbon black using inkjet or gravure processes. In this embodiment, the EL unit(s) 14 and scattering layer 22 are deposited between the light-absorbing portions 28, and the light-absorbing portions 28 extend above the scattering layer 22 to form the light-transmissive portions 26 of the contrast-enhancement element 24. In this embodiment, it is possible that the EL unit(s) 14 and scattering layer 22 materials may also be deposited over, rather than only between, the light-absorbing portions 28 (not shown). Such deposition would not have any significant detrimental effect on the performance of the LED device. In yet another alternative embodiment shown in FIG. 6, the light-absorbing portions 28 and light-transmissive portions 26 of the contrast-enhancement element 24 may be formed on electrode 16 of LED 40, or on protective layers formed on the electrode 16 (not shown). In the bottom-emitting embodiment of FIG. 4, the contrast-enhancement element 24 may be formed directly on the substrate 10 (or layers deposited on the substrate) using, for example, photolithographic processes with low-index transparent materials and light-absorbing resins. Such patternable resins are commercially available.

Figure 11A:
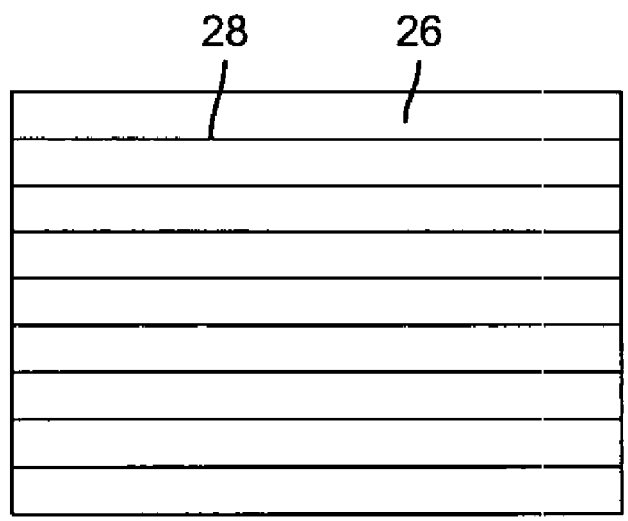
FIGS. 11a and 11b illustrate a top view of the light-absorbing portions of embodiments of the present invention.
Figure 11B:
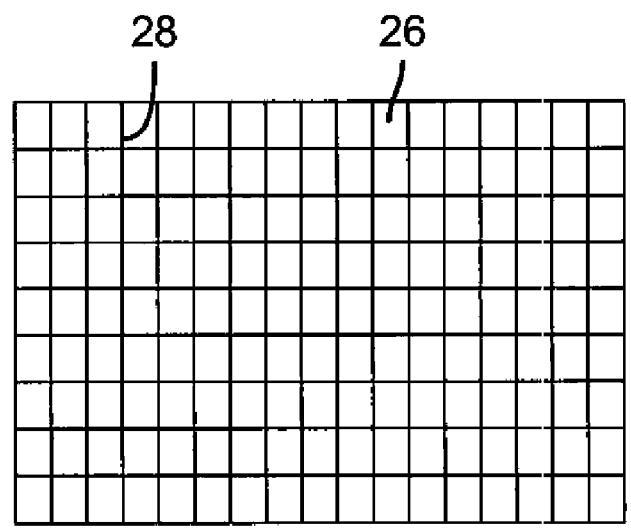

The light-absorbing portions 28 of the contrast-enhancement element 24 may be formed in any arrangement over the light-emissive area 70. For example, the light-absorbing portions 28 may be formed in lines (FIG. 11a) in any desired direction or they may form a grid pattern as illustrated in FIG. 11b.

Figure 2:
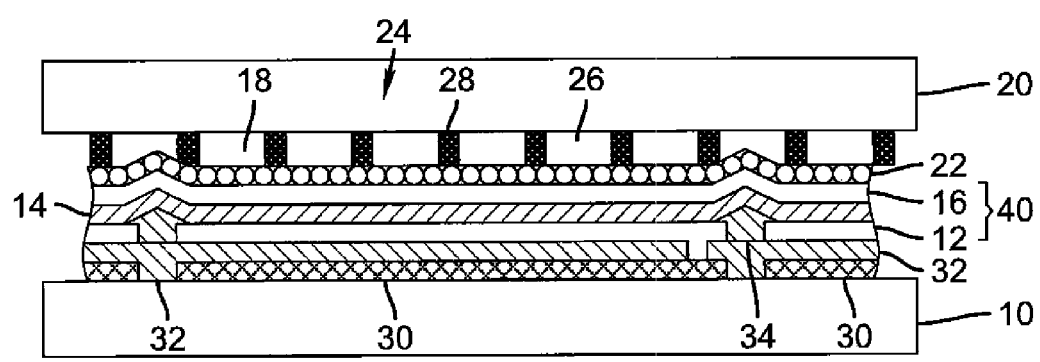
FIG. 2 illustrates a cross section of a top-emitter LED device according to an alternative embodiment of the present invention.
Figure 3:
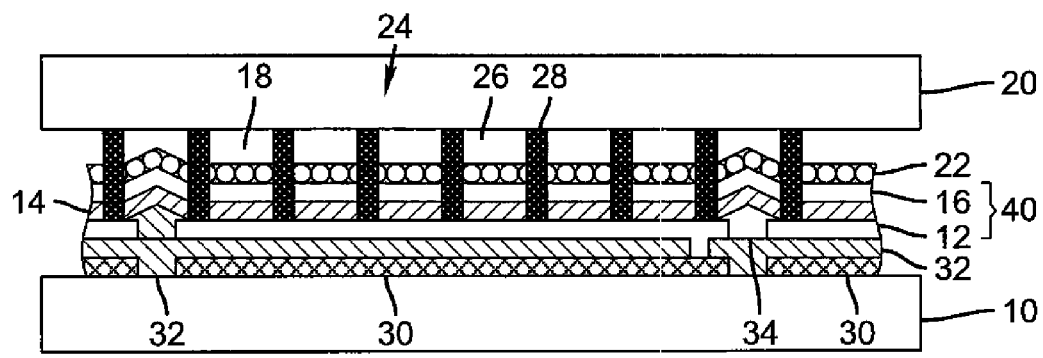
FIG. 3 illustrates a cross section of a top-emitter LED device according to yet another embodiment of the present invention.
Figure 7:
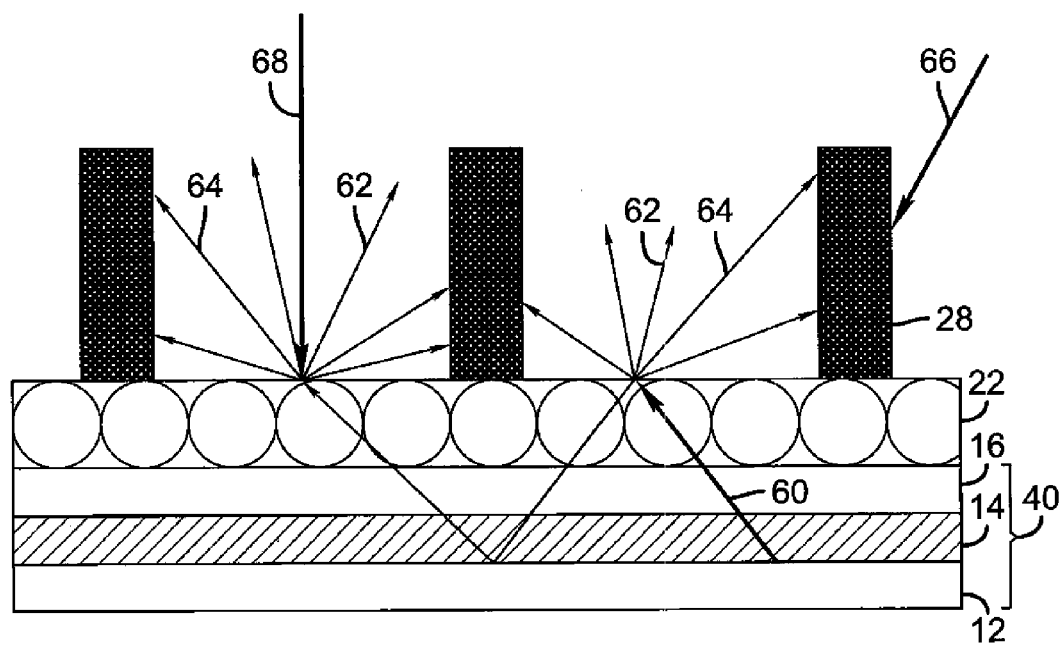
FIG. 7 illustrates a cross section of a top-emitter LED device illustrating emitted light rays according to an embodiment of the present invention.

Referring to FIGS. 2 and 7, in operation the electrodes 12 and 16 are driven by the electronic components 30 to provide a current through the EL unit(s) 14, causing them to emit light 60. The emitted light 60 then travels through the transparent electrode 16 or is reflected from the reflective electrode 12 and then travels through the transparent electrode 16. The light then encounters the scattering layer 22 and is scattered out of the device or back toward the reflective electrode 12, is reflected, and then is re-scattered until the light is eventually scattered out of the LED or absorbed. Because the scattering layer 22 is in close optical contact with the transparent electrode 16 and, preferably, no low-index layers are formed between the scattering layer 22 and the LED 40, all of the emitted light (shown by light rays 1, 2, 3, and 4 in FIG. 9) is scattered and none is lost. The light scattered out of the LED then enters the low-index layer 18 (in this embodiment, light-transmissive portions 26 of the contrast-enhancement element 24). Because the low-index layer 18 has a lower optical index than the cover 20, light that passes into the low-index medium 18 cannot be trapped in the cover 20 and thus can escape from the electroluminescent device. Light 62 that passes through into a low-index light-transmissive portion 26 of the contrast-enhancement element 24 can then escape from the LED. However, light 64 that encounters the light-absorbing portion 28 of the contrast-enhancement element 24 will be absorbed.

Ambient light 66 incident on the electroluminescent device at a relatively high angle to the normal may encounter the light-absorbing portions 28 of the contrast-enhancement element 24 and be absorbed, thereby improving the contrast of the electroluminescent device. Ambient light 68 approximately normally incident on the electroluminescent device encounters the light-transmissive portions 26 of the contrast-enhancement element 24 and is scattered (as is the emitted light 60). Portions of this scattered light will be emitted light 62 that escapes from the LED device or absorbed light 64.

The amount of emitted light 60 that escapes from the LED device will depend on the width and height of the light-absorbing portions 28, as well as the relative spacing between portions 26 and 28. Likewise, the amount of absorbed ambient light will also depend on such factors. In general, it is preferred that to make the light-absorbing portion 28 as thin as possible in the horizontal direction such that the height of the light-absorbing portions in a vertical dimension orthogonal to the substrate is greater than the minimum width of the light-absorbing portions in a horizontal dimension parallel to the substrate as shown in FIG. 7. Likewise, minimum reflection of ambient light is found when the height of the light-absorbing portions 28 is large relative to the spacing between the portions 28, such that the height of the light-absorbing portions in a vertical dimension orthogonal to the substrate is greater than the minimum width of the light-transmissive portions in a horizontal dimension parallel to the substrate as shown in FIG. 8.

Figure 8:
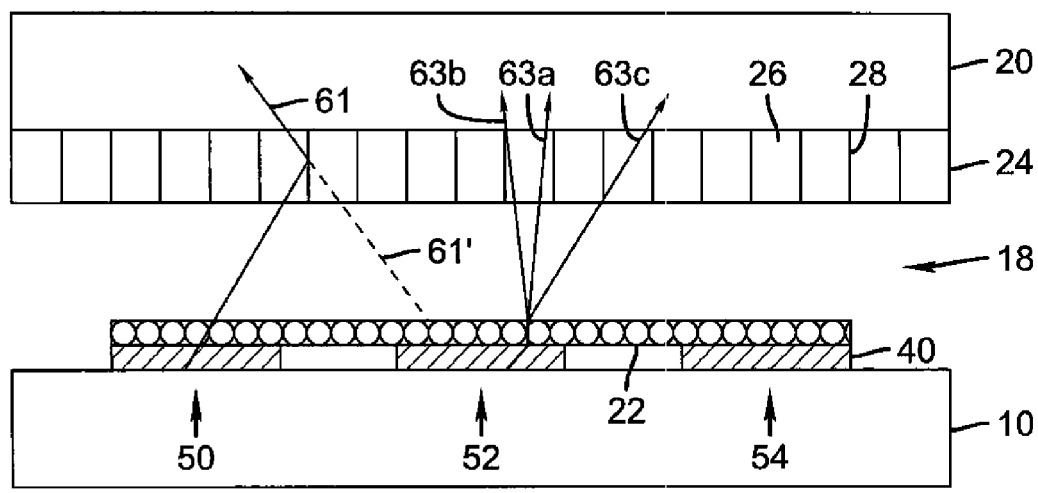
FIG. 8 illustrates a cross section of a top-emitter LED device illustrating emitted light rays according to an embodiment of the present invention.

Referring to FIG. 8, if the contrast-enhancement layer 24 is formed at a distance from the light-scattering layer 22 comparable to the distance between light-emitting pixels 50, 52, and 54, light 61 that is emitted from a pixel 50 and reflected from the sides of the light-absorbing portions 28 (rather than absorbed as desired) will appear to be emitted from a neighboring pixel 52 (shown with light ray 61'), thereby reducing the sharpness of the pixellated electroluminescent device. Moreover, if the contrast-enhancement layer 24 is located distant from the scattering layer 22, the angle of emission subtended by light rays 63a and 63b may be relatively small, despite some light rays 63c escaping through other light-transmissive areas 26, thereby reducing the viewing angle of emitted light. In contrast, if the contrast-enhancement film 24 is located near or on the scattering layer 22, light reflected from the sides of the light-absorbing portions 28 will not appear to be emitted from neighboring pixels and the angle of emission through a light-transmissive area 26 will be relatively large, providing an increased viewing angle and sharpness. The substrate 10 and cover 20 are typically the thickest elements of a flat-panel display device. Hence, as taught in the present invention, to maximize light output and sharpness the contrast-enhancement layer 24 is located between the light-scattering layer 22 and the transparent substrate 10 or cover 20 through which light is emitted, such that the contrast-enhancement element 24 is advantageously located substantially closer to the scattering layer 22 than would be the case if the element 24 was located on the outside of the substrate or cover through which light is emitted.

Ambient light 68 orthogonally incident on the electroluminescent device of the present invention will tend to pass through the light-transmissive portions 26 of element 24. In the absence of a scattering layer 22, such light will be reflected by electrode 12, reducing the ambient contrast of the electroluminescent device. In accordance with the present invention, such ambient light 68 will strike the scattering layer 22 and be redirected in all directions. While light 62 scattered roughly orthogonal to the surface will escape, light 64 scattered at a high angle to the surface normal will be absorbed by portions 28.

The present invention provides improved contrast over the prior art for at least two reasons. First, because almost all of the ambient light passes through the contrast-enhancement element 24 twice at two different angles, ambient light absorption is greatly increased. In contrast, the emitted light 60 will pass through the contrast-enhancement element 24 only once. Secondly, as noted above, light emitted by the electroluminescent that would otherwise be trapped is scattered out of the electroluminescent device by the scattering layer 22, thereby increasing the amount of light emitted into the low-index layer 18 and the brightness of the LED. Moreover, unlike prior-art solutions employing neutral-density filters, polarizers, or circular polarizers, light 62 that is scattered relatively orthogonally to the surface will be directly emitted from the electroluminescent without passing through any filtering medium and suffering light losses. However, as noted above, the viewing angle of the electroluminescent device may also be reduced.

Applicants have constructed an embodiment of the present invention employing a grid configuration (FIG. 11$b$) of contrast-enhancement element 24 0.04 inches thick. After normalizing the output to that of an electroluminescent without a scattering layer or contrast-enhancement element 24 and adjusting the light reflection measurements for front-surface reflections, the following performance values were obtained under semi-diffuse illumination according to VESA ambient contrast measurement standard with emitted and reflected light measured at a normal to the surface:

| Device | Reflection | Emitted | Ratio |
| --- | --- | --- | --- |
| EL Device | 100% | 100% | 1.00 |
| EL Device with scattering layer | 48.8% | 170% | 3.48 |
| Present Invention | 1.8% | 170% | 94 |
| EL Device with circular polarizer | 1.1% | 44% | 40 |

Because the electroluminescent device can be optimized in a variety of ways, this example is illustrative only. The ambient contrast ratio (ACR) is dependent on the level of ambient illumination. Although the reflectivity of the electroluminescent with circular polarizer is lower than that of the present invention example, the ACR within the viewing angle defined by the contrast-enhancement element of the present invention will be higher than that of the prior-art electroluminescent device because the present invention has greater light output within the viewing angle.

In preferred embodiments, the cover 20 and substrate 10 may comprise glass or plastic with typical refractive indices of between 1.4 and 1.6. The transparent low-index element 18 may comprise a solid layer of optically transparent material, a void, or a gap. Voids or gaps may be a vacuum or filled with an optically transparent gas or liquid material. For example air, nitrogen, helium, or argon all have a refractive index of between 1.0 and 1.1 and may be employed. Lower index solids which may be employed include fluorocarbon or MgF, each having indices less than 1.4. Any gas employed is preferably inert. The reflective electrode is preferably made of metal (for example aluminum, silver, or magnesium) or metal alloys. The transparent electrode is preferably made of transparent conductive materials, for example indium tin oxide (ITO) or other metal oxides. The EL unit(s) 14 may comprise organic materials known in the art, for example, hole-injection, hole-transport, light-emitting, electron-injection, and/or electron-transport layers. Such organic material layers are well known in the OLED art. The organic material layers typically have a refractive index of between 1.6 and 1.9, while indium tin oxide has a refractive index of approximately 1.8-2.1. Hence, the various layers organic and transparent electrode layers in the OLED have a refractive index range of 1.6 to 2.1. Alternatively, EL unit 14 may comprise inorganic semiconductor materials whose refractive index range is typically between 1.8 and 3.0. Of course, the refractive indices of various materials may be dependent on the wavelength of light passing through them, so the refractive index values cited here for these materials are only approximate. In any case, the transparent low-index element 18 preferably has a refractive index at least 0.1 lower than that of each of the first refractive index range and the second refractive index at the desired wavelength for the LED emitter.

Scattering layer 22 may comprise a volume scattering layer or a surface scattering layer. In certain embodiments, e.g., scattering layer 22 may comprise materials having at least two different refractive indices. The scattering layer 22 may comprise, e.g., a matrix of lower refractive index and scattering elements have a higher refractive index. Alternatively, the matrix may have a higher refractive index and the scattering elements may have a lower refractive index. For example, the matrix may comprise silicon dioxide or cross-linked resin having indices of approximately 1.5, or silicon nitride with a much higher index of refraction. If scattering layer 22 has a thickness greater than one-tenth part of the wavelength of the emitted light, then it is desirable for the index of refraction of at least one material in the scattering layer 22 to be approximately equal to or greater than the first refractive index range. This is to insure that all of the light trapped in the EL unit 14 and transparent electrode can experience the direction altering effects of scattering layer 22. If scattering layer 22 has a thickness less than one-tenth part of the wavelength of the emitted light, then the materials in the scattering layer need not have such a preference for their refractive indices.

In an alternative embodiment, scattering layer 22 may comprise particles deposited on another layer, e.g., particles of titanium dioxide may be coated over transparent electrode 16 to scatter light. Preferably, such particles are at least 100 nm in diameter to optimize the scattering of visible light. In a further alternative, scattering layer 22 may comprise a rough, diffusely reflecting or refracting surface of electrode 12 or 16 itself.

The scattering layer 22 is typically adjacent to and in contact with, or close to, an electrode to defeat total internal reflection in the organic layers 14 and transparent electrode 16. However, if the scattering layer 22 is between the electrodes 12 and 16, it may not be necessary for the scattering layer to be in contact with an electrode 12 or 16 so long as it does not unduly disturb the generation of light in the EL unit 14. According to an embodiment of the present invention, light emitted from the EL unit 14 can waveguide along the EL unit 14 and electrode 16 combined, since the EL unit 14 have a refractive index lower than that of the transparent electrode 16 and electrode 12 is reflective. The scattering layer 22 or surface disrupts the total internal reflection of light in the combined layers 14 and 16 and redirects some portion of the light out of the combined layers 14 and 16. To facilitate this effect, the transparent low-index element 18 should not itself scatter light, and should be as transparent as possible. The transparent low-index element 18 is preferably at least one micron thick to ensure that emitted light properly propagates through the transparent low-index element and is transmitted through the cover 20.

It is important to note that a scattering layer will also scatter light that would have been emitted out of the device back into the EL unit 14, exactly the opposite of the desired effect. Hence, the use of optically transparent layers that are as thin as possible is desired in order to extract light from the device with as few reflections as possible.

Whenever light crosses an interface between two layers of differing index (except for the case of total internal reflection), a portion of the light is reflected and another portion is refracted. Unwanted reflections can be reduced by the application of standard thin anti-reflection layers. Use of anti-reflection layers may be particularly useful on both sides of the cover 20, for top emitters, and on both sides of the transparent substrate 10, for bottom emitters.

The scattering layer 22 can employ a variety of materials. For example, randomly located spheres of titanium dioxide may be employed in a matrix of polymeric material. Alternatively, a more structured arrangement employing ITO, silicon oxides, or silicon nitrides may be used. In a further embodiment, the refractive materials may be incorporated into the electrode itself so that the electrode is a scattering layer. Shapes of refractive elements may be cylindrical, rectangular, or spherical, but it is understood that the shape is not limited thereto. The difference in refractive indices between materials in the scattering layer 22 may be, for example, from 0.3 to 3, and a large difference is generally desired. The thickness of the scattering layer, or size of features in, or on the surface of, a scattering layer may be, for example, 0.03 to 50 μm. It is generally preferred to avoid diffractive effects in the scattering layer. Such effects may be avoided, for example, by locating features randomly or by ensuring that the sizes or distribution of the refractive elements are not the same as the wavelength of the color of light emitted by the device from the light-emitting area.

The scattering layer 22 should be selected to get the light out of the LED as quickly as possible so as to reduce the opportunities for re-absorption by the various layers of the LED device. If the scattering layer 22 is to be located between the EL unit 14 and the transparent low-index element 18, or between the EL unit 14 and a reflective electrode, then the total diffuse transmittance of the same layer coated on a glass support should be high (preferably greater than 80%). In other embodiments, where the scattering layer 22 is itself desired to be reflective, then the total diffuse reflectance of the same layer coated on a glass support should be high (preferably greater than 80%). In all cases, the absorption of the scattering layer should be as low as possible (preferably less than 5%, and ideally 0%).

Materials of the light scattering layer 22 can include organic materials (for example polymers or electrically conductive polymers) or inorganic materials. The organic materials may include, e.g., one or more of polythiophene, PEDOT, PET, or PEN. The inorganic materials may include, e.g., one or more of $SiO_x$ (x>1), $SiN_x$ (x>1), $Si_3N_4$, $TiO_2$, MgO, ZnO, $Al_2O_3$, $SnO_2$, $In_2O_3$, $MgF_2$, and $CaF_2$. The scattering layer 22 may comprise, for example, silicon oxides and silicon nitrides having a refractive index of 1.6 to 1.8 and doped with titanium dioxide having a refractive index of 2.5 to 3. Polymeric materials having refractive indices in the range of 1.4 to 1.6 may be employed having a dispersion of refractive elements of material with a higher refractive index, for example titanium dioxide.

Conventional lithographic means can be used to create the scattering layer using, for example, photo-resist, mask exposures, and etching as known in the art. Alternatively, coating may be employed in which a liquid, for example polymer having a dispersion of titanium dioxide, may form a scattering layer 22.

One problem that may be encountered with such scattering layers is that the electrodes may tend to fail open at sharp edges associated with the scattering elements in the layer 22. Although the scattering layer may be planarized, typically such operations do not form a perfectly smooth, defect-free surface. To reduce the possibility of shorts between the electrodes 12 and 16, a short-reduction layer may be employed between the electrodes. Such a layer is a thin layer of high-resistance material (for example having a through-thickness resistivity between $10^{-7}$ ohm-$cm^2$ to $10^3$ ohm-$cm^2$). Because the short-reduction layer is very thin, device current can pass between the electrodes through the device layers but leakage current through the shorts are much reduced. Such layers are described in US2005/0225234, filed Apr. 12, 2004, the disclosure of which is incorporated herein by reference.

Most LED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890 issued May 8, 2001 to Boroson et al. In addition, barrier layers such as $SiO_x$ (x>1), Teflon, and alternating inorganic/polymeric layers are known in the art for encapsulation.

In particular, very thin layers of transparent encapsulating materials (not shown) may be deposited on the electrode. In this case, the scattering layer 22 may be deposited over the layers of encapsulating materials. This structure has the advantage of protecting the electrode 16 during the deposition of the scattering layer 22. Preferably, the layers of transparent encapsulating material have a refractive index comparable to the first refractive index range of the transparent electrode 16 and EL unit 14, or is very thin (e.g., less than about 0.2 micron) so that wave-guided light in the transparent electrode 16 and EL unit 14 will pass through the layers of transparent encapsulating material and be scattered by the scattering layer 22.

LED devices of this invention can employ various well-known optical effects in order to enhance their properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing neutral density filters over the display. Filters, polarizers, and anti-glare or anti-reflection coatings may be specifically provided over the cover or as part of the cover.

The present invention may also be practiced with either active- or passive-matrix electroluminescent devices. It may also be employed in display devices. In one embodiment, the present invention is employed in a flat-panel OLED device composed of small molecule or polymeric OLEDs as disclosed in, but not limited to U.S. Pat. No. 4,769,292, issued Sep. 6, 1988 to Tang et al., and U.S. Pat. No. 5,061,569, issued Oct. 29, 1991 to VanSlyke et al. In another embodiment, the present invention is employed in a flat panel inorganic LED device containing quantum dots as disclosed in, but not limited to U.S. Patent Application Publication No, 2007/0057263 entitled "Quantum dot light emitting layer" and pending U.S. application Ser. No. 11/683,479, by Kahen, which are both hereby incorporated by reference in their entirety. Many combinations and variations of organic, inorganic and hybrid light-emitting displays can be used to fabricate such a device, including both active- and passive-matrix LED displays having either a top- or bottom-emitter architecture.

The invention has been described in detail with particular reference to certain preferred embodiments thereof, but it will be understood that variations and modifications can be effected within the spirit and scope of the invention.

PARTS LIST 1, 2, 3, 4, 5, 6 light rays
10 substrate
12 electrode
13 transparent electrode layer
14 EL unit(s)
15 reflective layer
16 electrode
18 low-index layer
19 gap 20 cover
22 scattering layer
24 contrast-enhancement element
26 light-transmissive portion
28 light-absorbing portion
30 thin-film transistors
31 semiconductor matrix
33 light emitting layer
32 planarization layer
34 planarization layer
35,37 charge transport layers
39 quantum dot
40 LED
50, 52, 54, 56, 58 pixel
60, 61, 61', 62, 63a, 63b, 63c, 64, 66, 68 light rays
70 light-emitting area

The invention claimed is:

1. An electroluminescent device, comprising:

an LED formed on a substrate having a first electrode formed over the substrate, a second electrode formed over the first electrode, and an EL unit formed between the electrodes, wherein at least one of the first or second electrodes is transparent, the EL unit having a first optical index, and wherein at least one of the first or second electrodes is patterned to define independently controllable light-emitting areas;

a cover formed over the LED and wherein the cover or substrate is transparent and has a second optical index and the light is emitted through the transparent cover or substrate;

a light-scattering layer formed between the cover and substrate for scattering light;

a low-index dement having an optical index lower than the first and second optical indices formed between the scattering layer and the transparent cover or substrate; and an electrically-insulating contrast-enhancement layer comprising a plurality of alternating light-absorbing portions and light-transmissive portions formed in a layer located between the light-scattering layer and the transparent substrate or cover through which the light is emitted on a side of the light-scattering layer opposite the transparent electrode and not in electrical contact with the transparent electrode, wherein a plurality of the light-absorbing portions and the light-transmissive portions are located in each light-emitting area.

2. The electroluminescent device of claim 1 wherein the height of the light-absorbing portions in a vertical dimension orthogonal to the substrate is greater than the minimum width of the light-absorbing portions in a horizontal dimension parallel to the substrate.

3. The electroluminescent device of claim 1 wherein the low-index element comprises the light-transmissive portions of the contrast-enhancement layer.

4. The electroluminescent device of claim 1 wherein the first electrode is patterned and the first electrode and substrate are transparent.

5. The electroluminescent device of claim 4 wherein the contrast-enhancement layer is formed between the transparent substrate and the light-emitting layer(s).

6. The electroluminescent device of claim 4 wherein the scattering layer is a transparent scattering layer formed between the transparent substrate and the light-emitting layer(s).

7. The electroluminescent device of claim 4 wherein the scattering layer is a reflective scattering layer formed between the cover and the light-emitting layer(s).

8. The electroluminescent device of claim 1 wherein the second electrode and the cover are transparent.

9. The electroluminescent device of claim 8 wherein the contrast-enhancement layer is formed on the inside of the cover.

10. The electroluminescent device of claim 8 wherein the contrast-enhancement layer is formed as a self-supporting film, 11. The electroluminescent device of claim 8 wherein the contrast-enhancement layer is formed on or over the transparent electrode.

12. The electroluminescent device of claim 8 wherein the scattering layer is a transparent scattering layer formed between the transparent cover and the light-emitting layer(s).

13. The electroluminescent device of claim 8 wherein the scattering layer is a reflective scattering layer formed between the substrate and the light-emitting layer(s).

14. The electroluminescent device of claim 1 wherein the light-absorbing portions comprise carbon black.

15. The electroluminescent device of claim 1 wherein the contrast-enhancement layer comprises a polymer or curable resin.

16. The electroluminescent device of claim 1 wherein the contrast-enhancement layer is formed photolithographically.

17. The electroluminescent device of claim 1 wherein the contrast-enhancement layer is less than 1 mm thick.

18. The electroluminescent device of claim 1 wherein the contrast-enhancement layer is less than 0.5 mm thick.

19. The electroluminescent device of claim 1 wherein the height of the light-absorbing portions in a vertical dimension orthogonal to the substrate is greater than the minimum width of the light-transmissive portions in a horizontal dimension parallel to the substrate.

20. The electroluminescent device of claim 1 wherein the height of the light-absorbing portions in a vertical dimension orthogonal to the substrate is greater than the minimum width of the light-absorbing portions in a horizontal dimension parallel to the substrate and greater than the minimum width of the light-transmissive portions in a horizontal dimension parallel to the substrate.

* * * * *